(12) United States Patent
Li et al.

(10) Patent No.: US 7,873,340 B2
(45) Date of Patent: Jan. 18, 2011

(54) METHOD TO TRACK ANALOG GAIN STEP MAGNITUDES ONLINE DURING OPERATION OF WIRELESS MOBILE DEVICES

(75) Inventors: Linbo Li, San Diego, CA (US); Fuyun Ling, San Diego, CA (US); Raghuraman Krishnamoorthi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1187 days.

(21) Appl. No.: 11/373,369

(22) Filed: Mar. 10, 2006

(65) Prior Publication Data

US 2006/0215793 A1 Sep. 28, 2006

Related U.S. Application Data

(60) Provisional application No. 60/660,718, filed on Mar. 10, 2005.

(51) Int. Cl.
*H04B 1/06* (2006.01)
*H04B 7/00* (2006.01)
*H04L 27/08* (2006.01)

(52) U.S. Cl. .............. 455/234.1; 455/245.1; 455/251.1; 375/345

(58) Field of Classification Search .............. 455/232.1, 455/234.1, 241.1, 245.1, 245.2, 250.1, 251.1; 375/345

See application file for complete search history.

(56) References Cited

U.S. PATENT DOCUMENTS

| 5,563,916 | A  | * | 10/1996 | Scarpa ........................ 375/345 |
| 6,181,201 | B1 | * | 1/2001  | Black .......................... 330/129 |
| 6,229,397 | B1 | * | 5/2001  | Miura ......................... 330/289 |
| 6,314,278 | B1 | * | 11/2001 | Zamat ..................... 455/239.1 |
| 6,625,433 | B1 |   | 9/2003  | Poirier et al. |
| 6,735,422 | B1 | * | 5/2004  | Baldwin et al. .......... 455/232.1 |
| 6,748,200 | B1 | * | 6/2004  | Webster et al. ........... 455/234.1 |
| 6,843,597 | B1 | * | 1/2005  | Li et al. ..................... 375/345 |
| 6,882,063 | B2 |   | 4/2005  | Droppo et al. |
| 7,062,243 | B2 | * | 6/2006  | Simmons et al. ......... 455/234.1 |
| 7,352,310 | B2 | * | 4/2008  | Mori et al. .................. 341/139 |

(Continued)

FOREIGN PATENT DOCUMENTS

EP 0413311 2/1991

(Continued)

OTHER PUBLICATIONS

International Search Report and Written Opinion - PCT/US2006/008485, International Search Authority - European Patent Office - Jul. 14, 2008 (040883U2).

*Primary Examiner*—Duc M Nguyen
(74) *Attorney, Agent, or Firm*—Gerald P. Joyce, III

(57) ABSTRACT

Systems and methods are provided for tracking and compensating for analog gain mismatches or changes in a receiver. In an embodiment, a method is provided to track analog gain step magnitudes during operation of a device. The method includes employing an error signal between an automatic gain control (AGC) output and a reference level as input to a gain step magnitude tracking component. This also includes determining at least one compensation value from the AGC output to update a nominal gain step magnitude that tracks an actual gain step magnitude.

48 Claims, 10 Drawing Sheets

U.S. PATENT DOCUMENTS

| | | | |
|---|---|---|---|
| 2002/0142745 A1* | 10/2002 | Kang et al. | 455/232.1 |
| 2002/0160734 A1* | 10/2002 | Li et al. | 455/245.1 |
| 2003/0092410 A1* | 5/2003 | Rahman | 455/232.1 |
| 2003/0143967 A1* | 7/2003 | Ciccarelli et al. | 455/232.1 |
| 2003/0207674 A1 | 11/2003 | Hughes | |
| 2004/0097209 A1 | 5/2004 | Haub et al. | |
| 2005/0047533 A1* | 3/2005 | Ruelke et al. | 375/345 |
| 2005/0146643 A1* | 7/2005 | Lee | 348/678 |
| 2006/0222118 A1* | 10/2006 | Murthy et al. | 375/345 |

FOREIGN PATENT DOCUMENTS

| | | |
|---|---|---|
| JP | 2004208175 | 7/2004 |
| JP | 2005327540 | 11/2005 |

* cited by examiner

METHOD TO TRACK ANALOG GAIN STEP MAGNITUDES ONLINE DURING OPERATION OF WIRELESS MOBILE DEVICES

CLAIM OF PRIORITY UNDER 35 U.S.C. §119

This application claims the benefit of U.S. Provisional Patent Application Ser. No. 60/660,718, filed on Mar. 10, 2005, entitled "ONLINE LNA GAIN STEP MAGNITUDE TRACKING FOR PADME AGC" the entirety of which is incorporated herein by reference.

BACKGROUND

I. Field

The subject technology relates generally to communications systems and methods, and more particularly to systems and methods that determine and perform analog gain step magnitude tracking and compensation.

II. Background

Wireless receivers that can be found in cell phones or other wireless devices employ various components to ensure fidelity of reception for received wireless signals. On the front end of these receivers are typically an antenna followed by a filter which is then followed by a low noise amplifier (LNA) to provide analog gain and to boost or reduce the respective signal accordingly depending on the strength of the signal received from the antenna. Output from the LNA is then passed to other intermediate processing components including an analog to digital converter (A/D) before being processed by a digital variable gain amplifier (DVGA). An AGC block controls both analog and digital components to ensure that the output signal level is constant. In general it is highly desirous to hold output power from the DVGA which is also the output from the AGC as constant as possible in order that the signal provided to the rest of the wireless receiver can be processed accordingly.

Typically, the AGC controls the output power of the signal by modifying analog and digital gains. The analog gain applied is controlled by gain adjustment signals from the AGC block. The analog gain can take several discrete values, which correspond to different analog gain states. The difference in the magnitude of the analog gain from one state to the next is called the analog gain step magnitude. Thus, if a change in signal strength were detected that was of large enough magnitude, a command is directed from the DVGA to the LNA, or the mixer, or both to change the gain state from one gain level or state to the next. After an analog gain state has been commanded to switch up or down, the DVGA can provide adjustments in order to attempt to hold the output power of the AGC as constant as possible. In order to command gain state changes, some thresholds have to be overcome before an actual gain state change is initiated by the DVGA. Hysteresis margins can be included in these thresholds to prevent unnecessary switching from one state to the next and back again in a short period of time which can have a negative impact on AGC performance.

One problem with the above approach relates to uncertainty associated with the analog gain step magnitudes. The gain step magnitude uncertainty originates partially from component mismatches within the AGC. Temperature variation is also known to have an impact on the gain step magnitude, which introduces an additional dynamic component of the uncertainty. The nominal gain step magnitude values are stored in AGC. The mismatch of the nominal gain step magnitude and the actual value creates at least the following problems: (1) reduction of hysteresis margin, leading to unnecessary switching of analog gain state, degrading receiver performance (2) saturation of the DVGA output, and (3) reduction of SQR (signal-to-quantization ratio) at the A/D output. A potential approach is to calibrate the analog gain steps for mobile devices in factory to compensate for component tolerances. However, an undesirable consequence is the individual calibration of every mobile device, which increases cost thus incurred. Moreover, the gain step magnitude uncertainty caused by temperature variation cannot be calibrated in advance.

SUMMARY

The following presents a simplified summary of various embodiments in order to provide a basic understanding of some aspects of the embodiments. This summary is not an extensive overview. It is not intended to identify key/critical elements or to delineate the scope of the embodiments disclosed herein. Its sole purpose is to present some concepts in a simplified form as a prelude to the more detailed description that is presented later.

Systems and methods are provided for determining compensation for gain magnitude steps as changes occur overtime (or due to component tolerances) in a wireless receiver. In one aspect, a tracking component monitors output from an automatic gain control circuit (AGC) in view of a reference signal or source. Based on the difference between the measured signal and the reference, adjustments are made to the digital gain correction applied to compensate for the analog gain change whenever there is a gain state transition. In an aspect, after an analog gain state transition, the associated error in dB that is detected between the AGC output energy and a predetermined energy reference operates as input to drive a gain step magnitude tracking block. The error between the AGC output energy and the energy reference is an existing internal variable of the AGC which is employed for the gain control logic. As a result, no new observable has to be generated for the operation of the analog gain step magnitude tracking algorithm.

After the LNA switches gain state, since a digital variable gain amplifier (DVGA) compensates for the analog gain change using stored nominal gain step magnitudes, the AGC output energy error from the energy reference can be modeled as a noisy observation of the gain step magnitude mismatch. The error signal is then multiplied with a loop gain to determine the correction to the nominal gain step magnitude. The correction term is applied on the stored gain step magnitude to update the nominal value. In an embodiment, a method is provided to track analog gain step magnitudes during operation of wireless mobile device. The method includes employing an error signal between an automatic gain control (AGC) output and a reference signal as input to a gain step magnitude tracking component. This also includes determining at least one compensation value from the AGC output to update a nominal gain step magnitude that tracks an actual gain step magnitude.

To the accomplishment of the foregoing and related ends, certain illustrative embodiments are described herein in connection with the following description and the annexed drawings. These aspects are indicative of various ways in which the embodiments may be practiced, all of which are intended to be covered.

DETAILED DESCRIPTION

Systems and methods are provided for tracking and compensating for gain errors or changes in a wireless receiver. In one embodiment, a method is provided to track analog gain step magnitudes during operation of wireless mobile device. The method includes employing an error signal between an automatic gain control (AGC) output and a reference signal as input to a gain step magnitude tracking component. This also includes determining at least one compensation value from the AGC output to update a nominal gain step magnitude that tracks an actual step magnitude in the analog circuitry. In one aspect, an existing error signal between the AGC output energy and the reference signal operates as input to a gain step magnitude tracking algorithm. A first order loop with loop gain $K_{StepMag}$ is used to update the nominal gain step magnitude and track the actual step magnitude. As a result, the gain step magnitude tracking algorithm can be implemented with minimal extra complexity. Since the algorithm tracks the gain step magnitude during operation mode of a mobile device, the need for calibration of the LNA in factory can be eliminated. Moreover, the tracking algorithm is also capable of tracking the dynamic component of the gain step magnitude uncertainty due to temperature variation, which cannot be measured in calibration procedure.

As used in this application, the terms "component," "network," "system," and the like are intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a communications device and the device can be a component. One or more components may reside within a process and/or thread of execution and a component may be localized on one computer and/or distributed between two or more computers. Also, these components can execute from various computer readable media having various data structures stored thereon. The components may communicate over local and/or remote processes such as in accordance with a signal having one or more data packets (e.g., data from one component interacting with another component in a local system, distributed system, and/or across a wired or wireless network such as the Internet).

Figure 1:
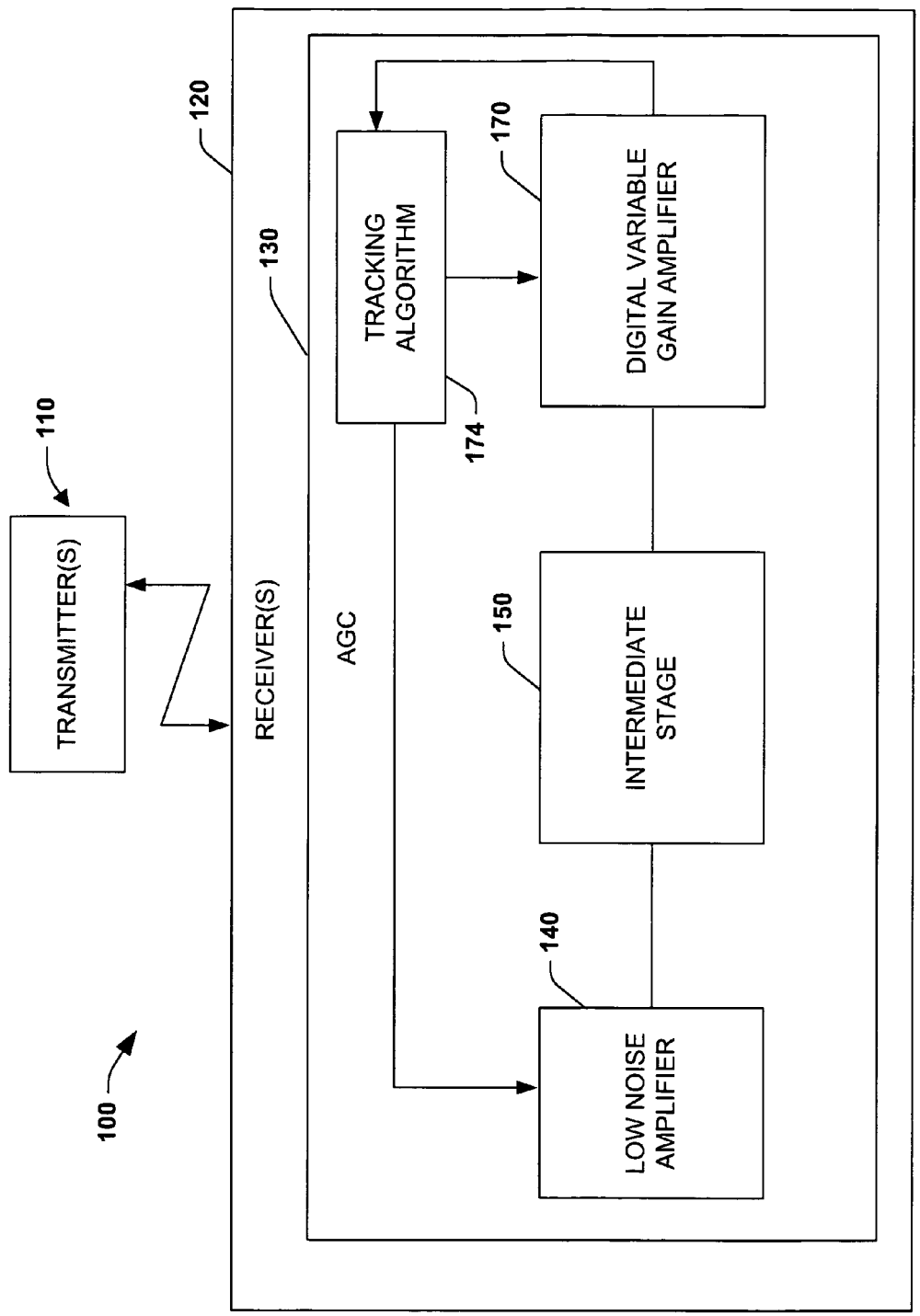
FIG. 1 is a schematic block diagram illustrating a gain compensation system for a wireless receiver.

FIG. 1 illustrates a gain compensation system 100 for a mobile wireless receiver. The system 100 includes one or more transmitters 110 that communicate across a wireless network to one or more receivers 120, where it is noted that the gain compensation embodiments disclosed herein are not limited to wireless receivers and can include substantially any type of receiver. The receivers 120 can include substantially any type of communicating device such as a cell phone, computer, personal assistant, hand held or laptop devices, and so forth. Portions of the receiver 120 are employed to receive an incoming signal from the wireless network (or wired network), perform initial processing such as gain control before sending the received signal to other portions of the receiver. An automatic gain control (AGC) block 130 includes a low noise amplifier (LNA) 140 that initially receives a filtered signal from an antenna (not shown). Output from the LNA 140 is fed to intermediate stage 150 such as mixers and A/D's which are described in more detail below.

A digital variable gain amplifier (DVGA) 170 receives signal data from the intermediate stage 150. The output power of the DVGA is compared to a reference in 174, which controls the analog and digital gains. Based on such monitoring, the AGC 130 can select the appropriate analog gain state by controlling the LNA 140 and the mixer. In addition, the AGC 130 can modify values associated with the gain step magnitudes in view of what is determined by the tracking and reference component 174. For example, as temperature changes, differences may appear between nominal values for gain step magnitudes and actual values. By monitoring the AGC output and determining differences between nominal and actual values via the tracking and reference component 174, gradual and dynamic adjustments can be made to the analog gain step magnitudes used for digital compensation 170 over time. Such adjustments can compensate for component tolerances or other factors such as parameter degradation due to temperature changes. In one embodiment, a system 100 is provided for determining analog gain step magnitude in a receiver. The system includes means for applying one or more gain step magnitudes (reference 140), means for tracking the gain step magnitudes (reference 174), and means for adjusting the gain step magnitudes to account for component shifts over time (reference 170).

As illustrated, the low noise amplifier (LNA) 140 feeds the intermediate stage 150 which is followed by the digital variable gain amplifier (DVGA) 170. The tracking component 174 can include a tracking algorithm that monitors output from the DVGA and feeds back controls to the analog components 140 based on the algorithm. Regarding the tracking algorithm, assume that in AGC update period n, that the error in dB of the DVGA output energy from the DVGA reference is Err(n). Thus, $$\mathrm{Err}(n) = E_{Ref} - E_{DVGAOut}(n).$$

Assuming the gain step magnitudes are known, the total gain (Analog gain and DVGA gain) is updated according to $$G(n) = G(n-1) + K_L(n-1) \cdot \mathrm{Err}(n-1),$$

where $K_L(n-1)$ is the DVGA loop gain for update period (n−1). The DVGA output energy can be written as $$E_{DVGAOut}(n) = G(n) + E_{RFIn}(n),$$

where $E_{RFIn}(n)$ is the RF input power at the LNA input, which we assume can be modeled as a steady component $E_0$ (the average received power) as follows $$E_{RFIn}(n) = E_0.$$

From the equations above, yields:

$$Err(n) = E_{Ref} - E_{DVGAOut}(n) \quad (1)$$
$$= E_{Ref} - G(n) - E_{RFIn}(n)$$
$$= E_{Ref} - G(n-1) - K_L(n-1) \cdot Err(n-1) - E_0$$
$$= (1 - K_L(n-1))E_{Ref} - (1 - K_L(n-1))G(n-1) -$$
$$(1 - K_L(n-1))E_0 + K_L(n-1).$$

Therefore $$Err(n) - (1 - K_L(n-1))Err(n-1) = 0.$$

From Equation 1, if there is no fading fluctuation in the RF received power, then $$E_{Ref} - E_{DVGAOut}(n) - (1 - K_L(n-1))Err(n-1) = 0.$$

In this static received power case, if the LNA switches gain state and the actual analog gain step magnitude is different from the nominal value stored in the DVGA 170, the total gain G(n) changes after the gain switching by this mismatch. Assume the mismatch between the actual and the nominal gain step magnitudes are represented by $\epsilon$, then $$Err(n) - (1 - K_L(n-1))Err(n-1) = \epsilon. \quad (2)$$

Figure 4:
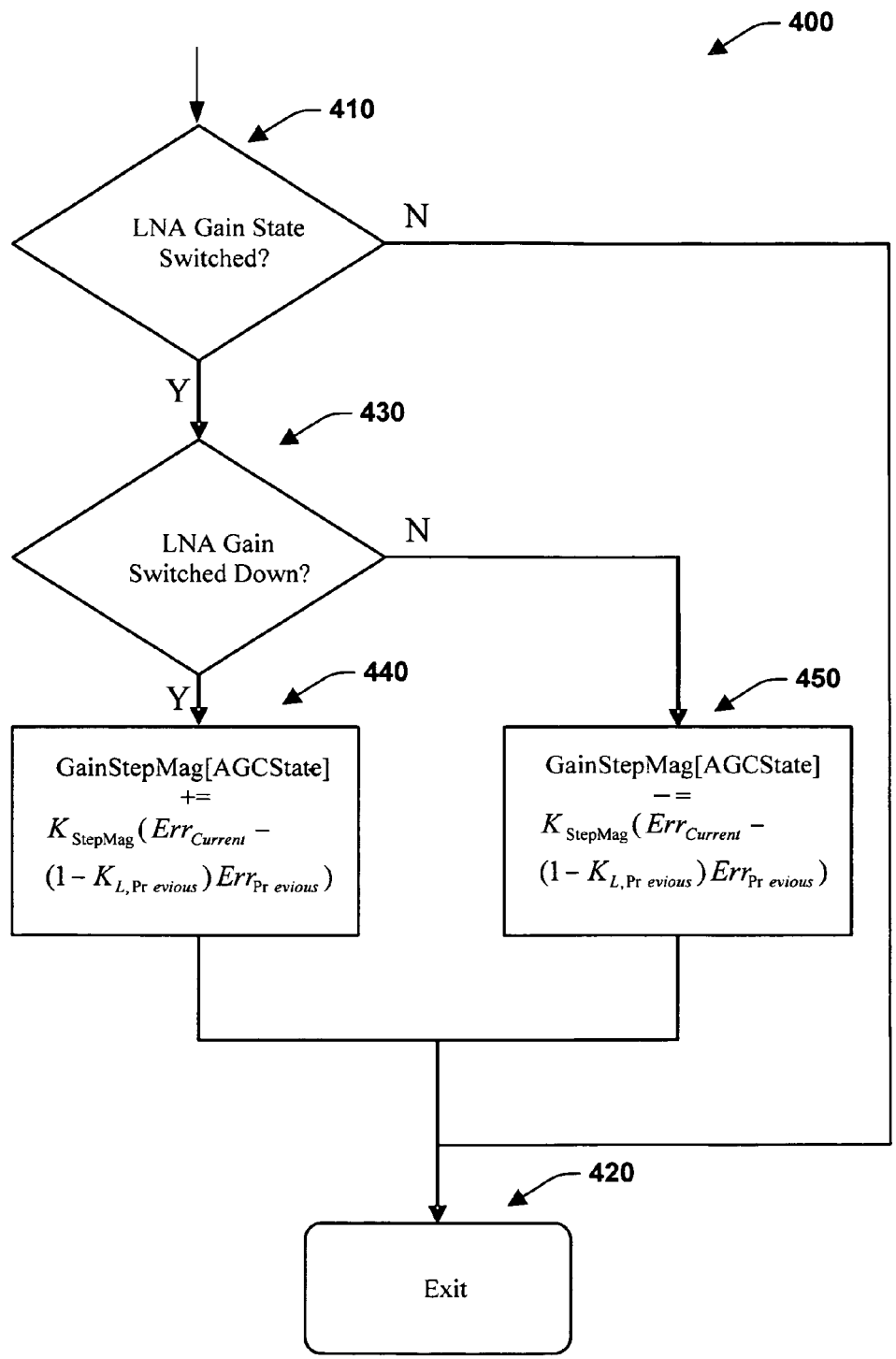
FIG. 4 is a diagram illustrating example process for gain magnitude tracking.

In Equation 2, $\epsilon$ is the gain step magnitude mismatch. A first-order loop can be used to track the gain step magnitude. Specifically, calculate $Err(n) - (1 - K_L(n-1))Err(n-1)$ just after LNA switches gain state, which is a noisy observation of the gain step magnitude mismatch, then multiply it with a loop gain $K_{StepMag}$, and apply the correction term $K_{StepMag}$ (Err $(n) - (1 - K_L(n-1))Err(n-1))$ on a register or buffer that stores the corresponding gain step magnitude. Considering that the LNA 140 and the mixer gain can be switched up or down, and accordingly the DVGA gain is decreased or increased at 170. A flow diagram for the on-line gain step magnitude tracking algorithm is shown in FIG. 4.

Figure 2:
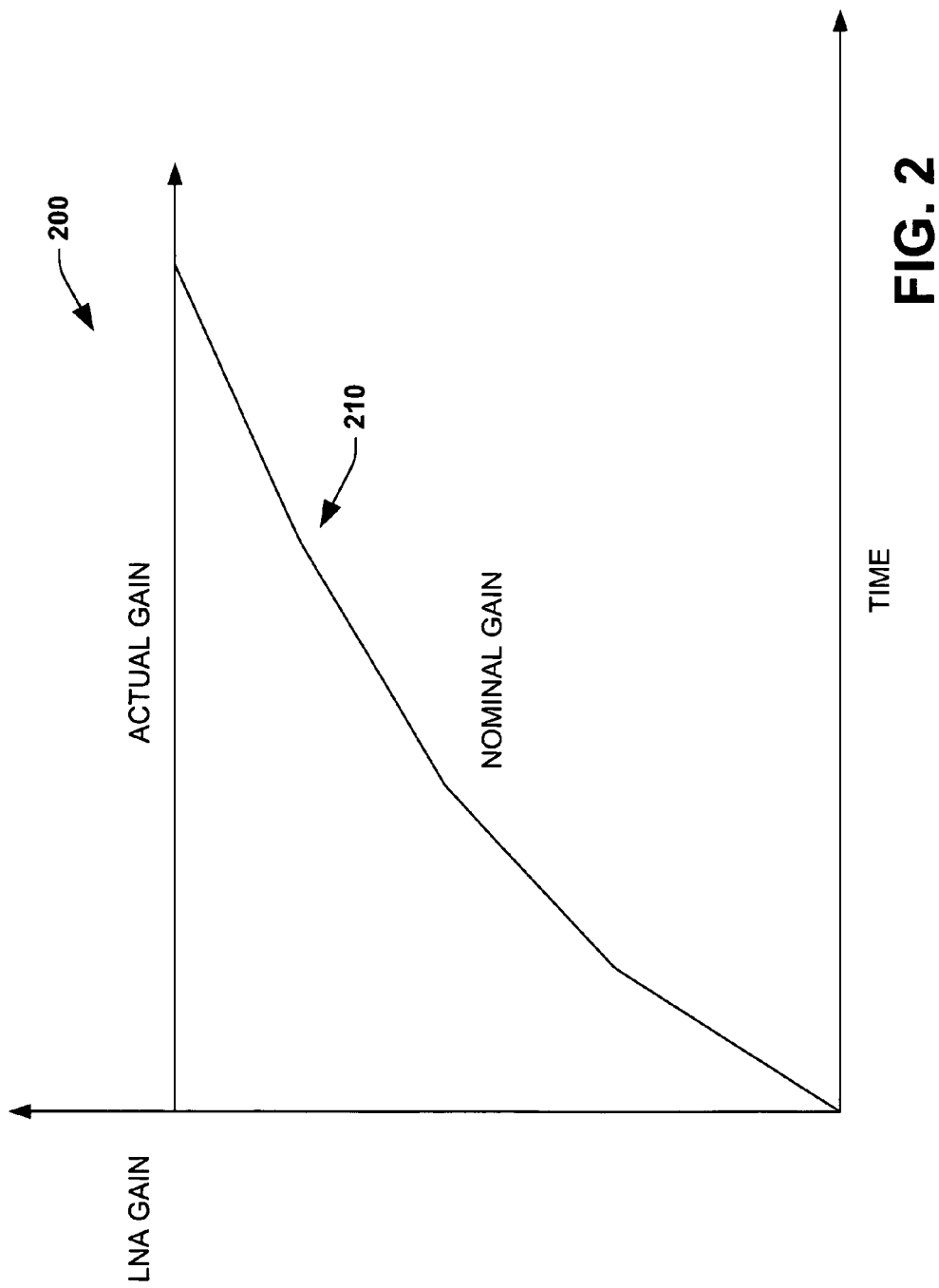
FIG. 2 an example diagram illustrating nominal gain tracking to actual amplifier gain over time.

Referring briefly to FIG. 2, a graph 200 shows how the gain step magnitude 210 is dynamically adjusted over time to track the actual gain step magnitude that has shifted due to component or environmental circumstances in the AGC 130. Referring back to FIG. 1, the tracking and compensation algorithm (not shown) adjusts the analog and digital gains to ensure that the signal level after the DVGA is constant. In addition to that, the tracking and compensation algorithm also tracks the actual gain step magnitude. One approach is to track the actual gain step magnitude online during operation of the receiver 120. Thus, after the LNA 140 switches gain state, the error in dB between the AGC output energy and a predetermined energy reference is determined as an input to drive the gain step magnitude tracking block which is part of reference numeral 174. The error between the AGC output energy and the energy reference at 174 is an existing internal variable of the AGC 130 which is employed for the gain control logic. As a result, no new observable is required to be generated for the operation of the step magnitude tracking algorithm.

After the LNA 140 switches gain state, or the mixer switches gain state (mixer is part of the intermediate stage 150 and described below), or both components switches gain state, since the DVGA 170 compensates for the analog gain change using stored nominal gain step magnitudes, the AGC output energy error from the reference is a noisy observation of a gain step magnitude mismatch. This error signal is multiplied with a loop gain to produce a correction to the nominal gain step magnitude. The correction term is applied on a stored gain step magnitude value to update the nominal value. Generally, the choice of the loop gain depends on the received power fluctuation across OFDM symbols. For larger power fluctuation across OFDM symbols, lower loop gain can be employed to suppress observation noise.

Figure 3:
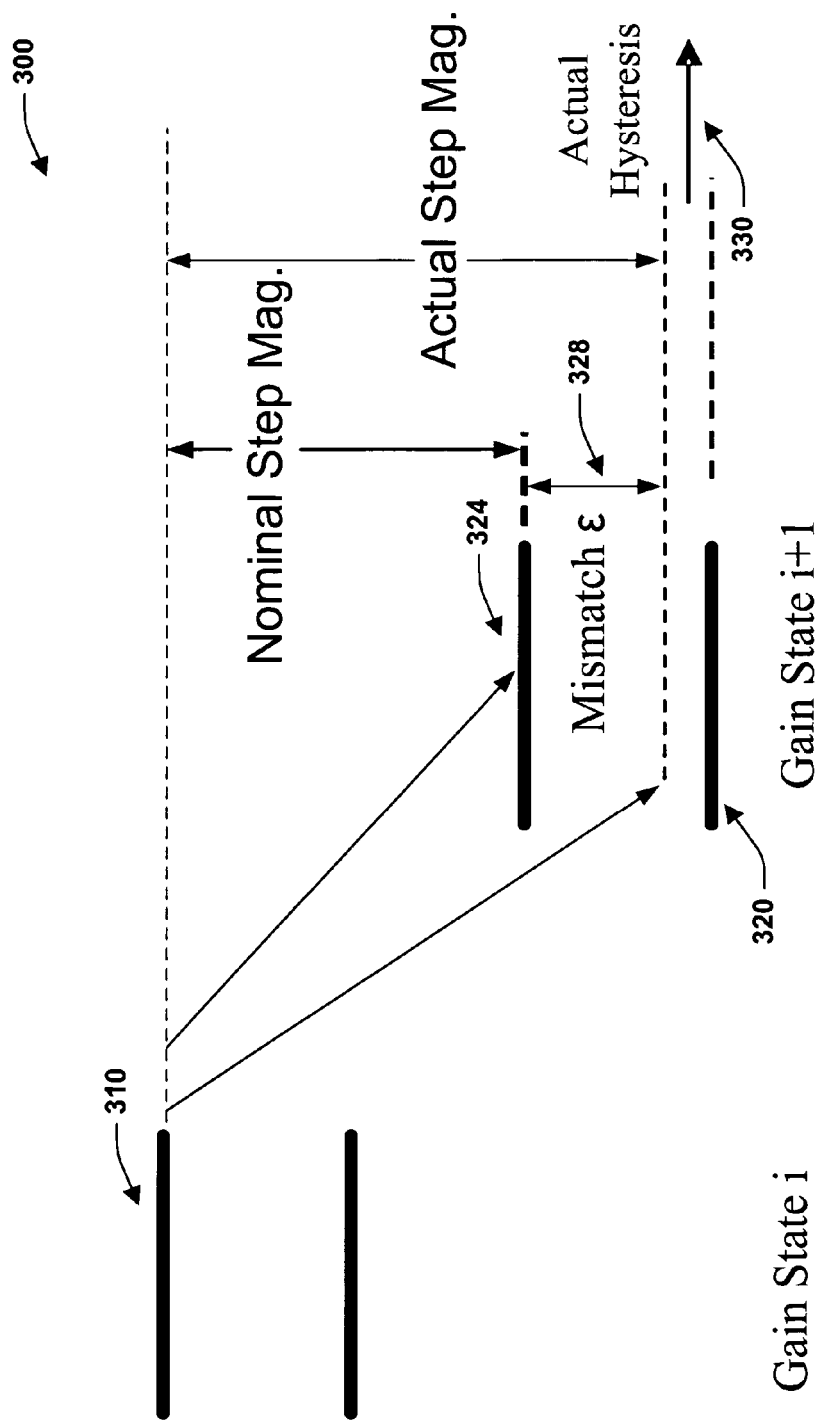
FIG. 3 is a diagram that illustrates a mismatch between nominal step magnitudes and actual step magnitudes in an AGC block.

FIG. 3 is a diagram 300 that illustrates a mismatch between nominal step magnitudes and actual step magnitudes in an AGC block. Before proceeding with a detailed description of the gain step magnitude tracking algorithm, FIG. 3 is provided to illustrate the type of errors that are being compensated by such algorithm or other component. In the diagram 300, a line 310 of gain state i is the maximum allowable RF input power above which the analog gain state will be switched down to avoid A/D saturation. Similarly, a line 320 of gain state i+1 is the minimum allowable RF input power under which the analog gain state will be switched up to improve signal-to-quantization ratio (SQR) at the A/D output. The margin between lines 320 and line 324 is the hysteresis. If the actual gain step magnitude is greater than the nominal value, the actual hysteresis of the system will be reduced by the amount of the mismatch $\epsilon$ at 328 and is shown at 330. The SQR reduction can also be observed from the diagram. Another problem that is caused by the mismatch 328 is DVGA saturation. Written in dB, the total gain, digital gain, and analog gain of the AGC satisfies: $Gain_{Total} = Gain_{Analog} + Gain_{Digital}$.

After the analog gain state changes, the analog gain and digital gain are adjusted according to the actual and the nominal gain step magnitudes. Suppose the analog gain is switched down, the total gain after gain switching is:

$$Gain_{Total}' = (Gain_{Analog} - Gain_{ActualStepMag}) + (Gain_{Digital} + Gain_{NominalStepMag}).$$

Therefore, the total gain variation after analog gain switching is $$Gain_{Total}' - Gain_{Total} = \epsilon = Gain_{NominalStepMag} - Gain_{ActualStepMag}.$$

If the mismatch $\epsilon > 0$ and the RF input power is constant before and after the analog gain switching, DVGA output energy will be $\epsilon$ dB above the DVGA reference energy, which increases the possibility of DVGA saturation. The impact of gain step uncertainty includes:

If analog gain is switched down
  If actual>nominal→reduced hysteresis and SQR
  If actual<nominal→saturation
If analog gain is switched up
  If actual>nominal→reduced hysteresis and saturation
  If actual<nominal→reduced SQR Proceeding to FIG. 4, the number of analog gain steps is denoted by M. Thus, M registers GainStepMag[1 . . . M] can be employed to store the current gain step magnitudes, where GainStepMag[i] denotes the gain step magnitude between gain state i and i+1. For one example of the proposed algorithm, the DVGA output energy error from the reference and the DVGA tracking loop gain for the update period just before the analog gain state transition are to be stored. As illustrated in FIG. 4, a determination is made at 410 whether analog gain state has been switched. If no switching occurs, the process ends at 420. If the gain state has been switched at 410, the process proceeds to 430 and determines whether gain states have been switched down. If yes, the process performs the following equation at 440:

$$GainStepMag[AGCState-1] \mathrel{+}=$$
$$K_{StepMag}(Err_{Current} - (1 - K_{L,Previous})Err_{Previous})$$

If the analog gain has not been switched down at 430, the process proceeds to 450 and performs the following equation:

GainStepMag[AGCState]-=$K_{StepMag}$(Err$_{current}$-(1-$K_{L,Previous}$)Err$_{Previous}$)

Let A(n) denote the observation Err(n)−(1−$K_L$ (n−1))Err (n−1), n(n) the observation noise and S(n) denote the mismatch between the nominal gain step magnitude and the true magnitude for the $n^{th}$ update period. The true gain step magnitude can be obtained by adding S(n) with the nominal step magnitude stored in DVGA registers. According to the process 400 in FIG. 4, yields:

$$A(n)=(\epsilon-S(n-1))+n(n),$$

$$S(n)=S(n-1)+K_{StepMag}A(n).$$

The above equations can be solved in z-domain as $$S(z) = \varepsilon\left(\frac{1}{1-z^{-1}} - \frac{1-K_{StepMag}}{1-(1-K_{StepMag})z^{-1}}\right) + \frac{K_{StepMag}n(z)}{1-(1-K_{StepMag})z^{-1}}.$$

Therefore, in time domain $$S(n) = \varepsilon(1-(1-K_{StepMag})^{n+1}) + K_{StepMag}\sum_{i=0}^{n}n(i)(1-K_{StepMag})^{n-i}. \quad (2)$$

From Equation 3, the first term, which is the steady-state component of S(n), converges to the magnitude mismatch ϵ if 0<K<2. If the observation noise sequence is zero-mean and independent, the variance of the residual tracking error due to observation noise can be calculated as $$\lim_{n\to\infty}\text{Var}\left[K_{StepMag}\sum_{i=0}^{n}n(i)(1-K_{StepMag})^{n-i}\right] = \frac{K_{StepMag}}{2-K_{StepMag}}\sigma_n^2,$$

where $\sigma_n^2$ is the variance of the observation noise n(n). Since rate of convergence is generally not critical in the gain step magnitude tracking (analog gain step magnitude usually depends on temperature variation and is not expected to change at fast rate), a small $K_{StepMag}$ can be selected to suppress the observation noise sufficiently.

Proceeding to FIG. 5, an example automatic gain control block 500 is illustrated. In this example, signal is received via antenna 510 and processed by a SAW (Surface Acoustic Wave) filter 520 before being sent to a low noise amplifier (LNA) 530. From the LNA 530, the signal is sent to a mixer 540 before being processed by a base band filter 550. Output from the filter 550 is processed by an analog to digital converter (A/D) 560 which sends digital signal information to a digital variable gain amplifier (DVGA) 570. An AGC tracking component 580 is employed to monitor and track the output from the DVGA 570. Based on the output of the AGC tracking block 580, the analog gain adjustments block 590 controls the LNA 530 and the Mixer 540 blocks. As shown, a gain step magnitude tracking component 594 is provided to monitor the AGC tracking component 580 and perform the analog gain step magnitude tracking. As can be appreciated, other configurations are possible for the AGC block 500.

Figure 6:
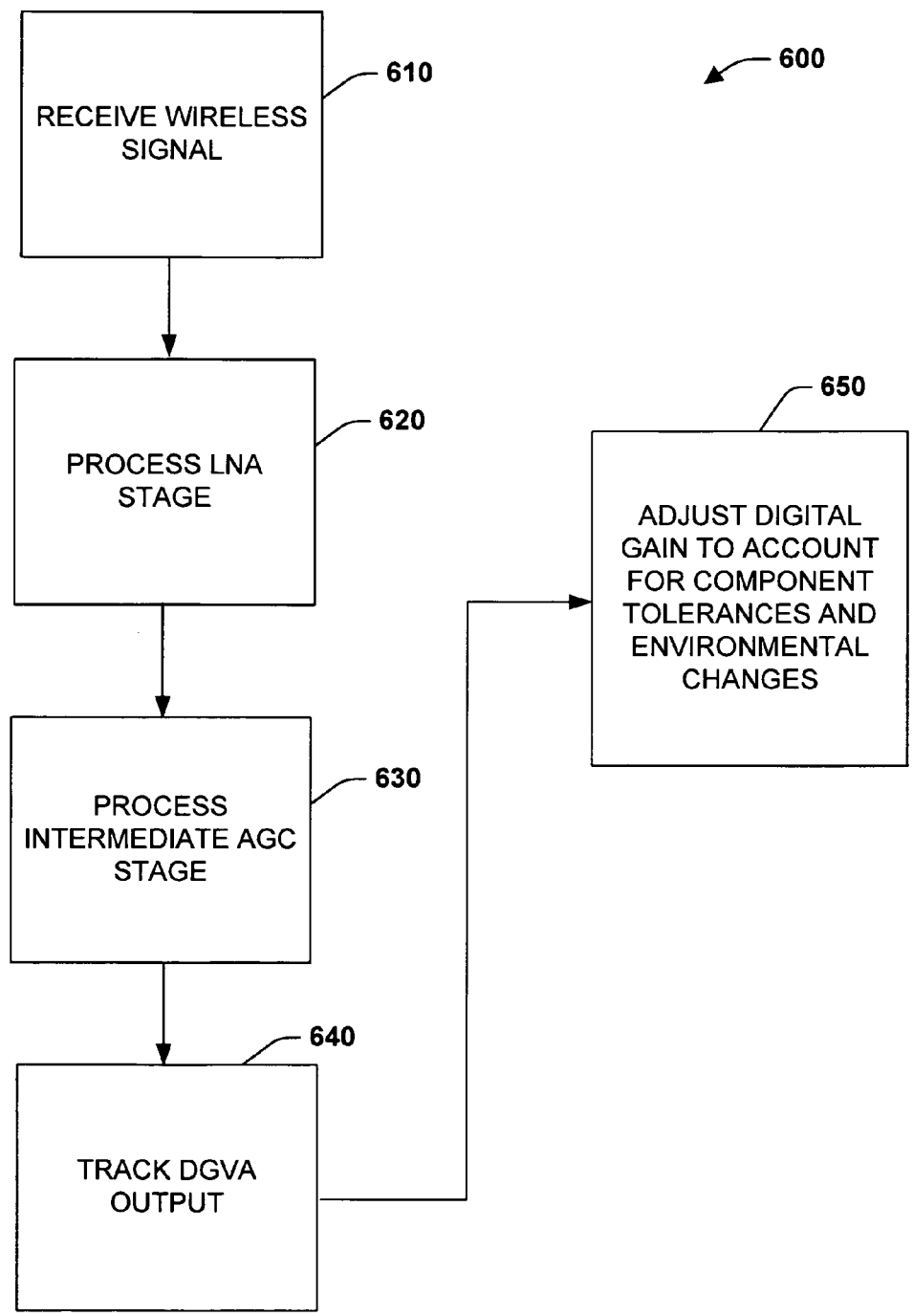
FIG. 6 illustrates an example AGC process for a wireless system.

FIG. 6 illustrates an example automatic gain control process 600 for wireless systems. While, for purposes of simplicity of explanation, the methodology for FIG. 6 and FIG. 4 above is shown and described as a series or number of acts, it is to be understood and appreciated that the processes described herein are not limited by the order of acts, as some acts may occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the subject methodologies disclosed herein.

Proceeding to 610, a wireless signal is received by a receiver and subsequently processed by a low noise amplifier at 620 which basically performs analog gain processing of the received signal. At 630, intermediate stage components such as mixers, other filters, analog to digital converters, and so forth process the received analog signal into a subsequent digital signal. As noted above, it is desirous to not saturate the A/D or provide signals that are too close to the quantization noise floor of the A/D. At 640, output from the A/D is sent to a digital variable gain amplifier where output of the amplifier is tracked and monitored as described above. At 650, nominal step magnitude values are adjusted, if necessary, in view of the monitoring and tracking that was performed at 640. Such adjustments can be made in view of component tolerances or mismatches and according to environmental conditions that may cause component parameter changes such as temperature or pressure changes for example.

Figure 7:
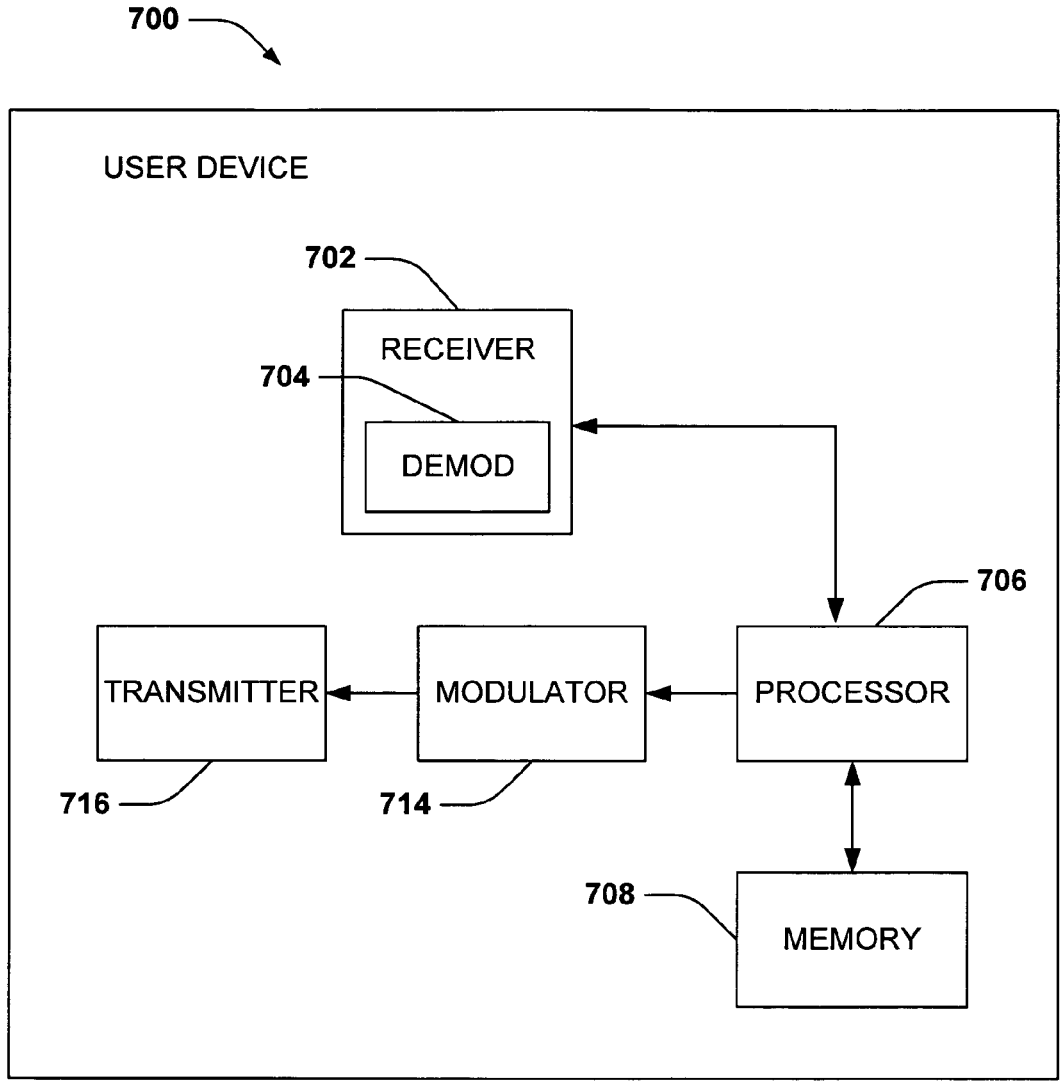
FIG. 7 is a diagram illustrating an example user device for a wireless system.

FIG. 7 is an illustration of a user device 700 that is employed in a wireless communication environment, in accordance with one or more aspects set forth herein. User device 700 comprises a receiver 702 that receives a signal from, for instance, a receive antenna (not shown), and performs typical actions thereon (e.g., filters, amplifies, down converts, etc.) the received signal and digitizes the conditioned signal to obtain samples. Receiver 702 can be a nonlinear receiver. A demodulator 704 can demodulate and provide received pilot symbols to a processor 706 for channel estimation. Processor 706 can be a processor dedicated to analyzing information received by receiver 702 and/or generating information for transmission by a transmitter 716, a processor that controls one or more components of user device 700, and/or a processor that both analyzes information received by receiver 702, generates information for transmission by transmitter 716, and controls one or more components of user device 700. User device 700 can additionally comprise memory 708 that is operatively coupled to processor 706 to perform gain compensation as previously described.

It will be appreciated that the data store (e.g., memories) components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). The memory 708 of the subject systems and methods is intended to comprise, without being limited to, these and any other suitable types of memory.

Figure 8:
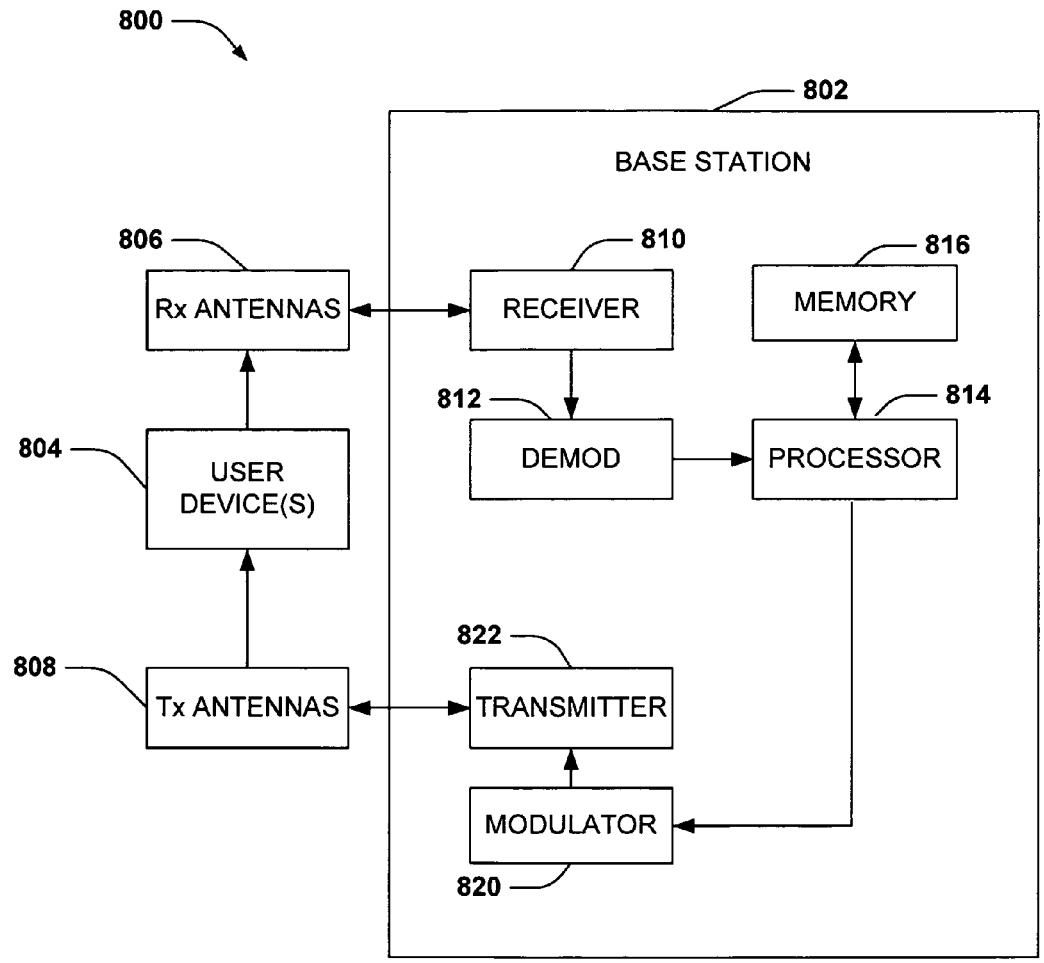
FIG. 8 is a diagram illustrating an example base station for a wireless system.

FIG. 8 is an illustrates an example system 800 that comprises a base station 802 with a receiver 810 that receives signal(s) from one or more user devices 804 through a plurality of receive antennas 806, and a transmitter 824 that transmits to the one or more user devices 804 through a transmit antenna 808. Receiver 810 can receive information from receive antennas 806 and is operatively associated with a demodulator 812 that demodulates received information. Demodulated symbols are analyzed by a processor 814 and which is coupled to a memory 816 that suitable information related to performing the various actions and functions set forth herein. A modulator 822 can multiplex a signal for transmission by a transmitter 824 through transmit antenna 808 to user devices 804.

Figure 9:
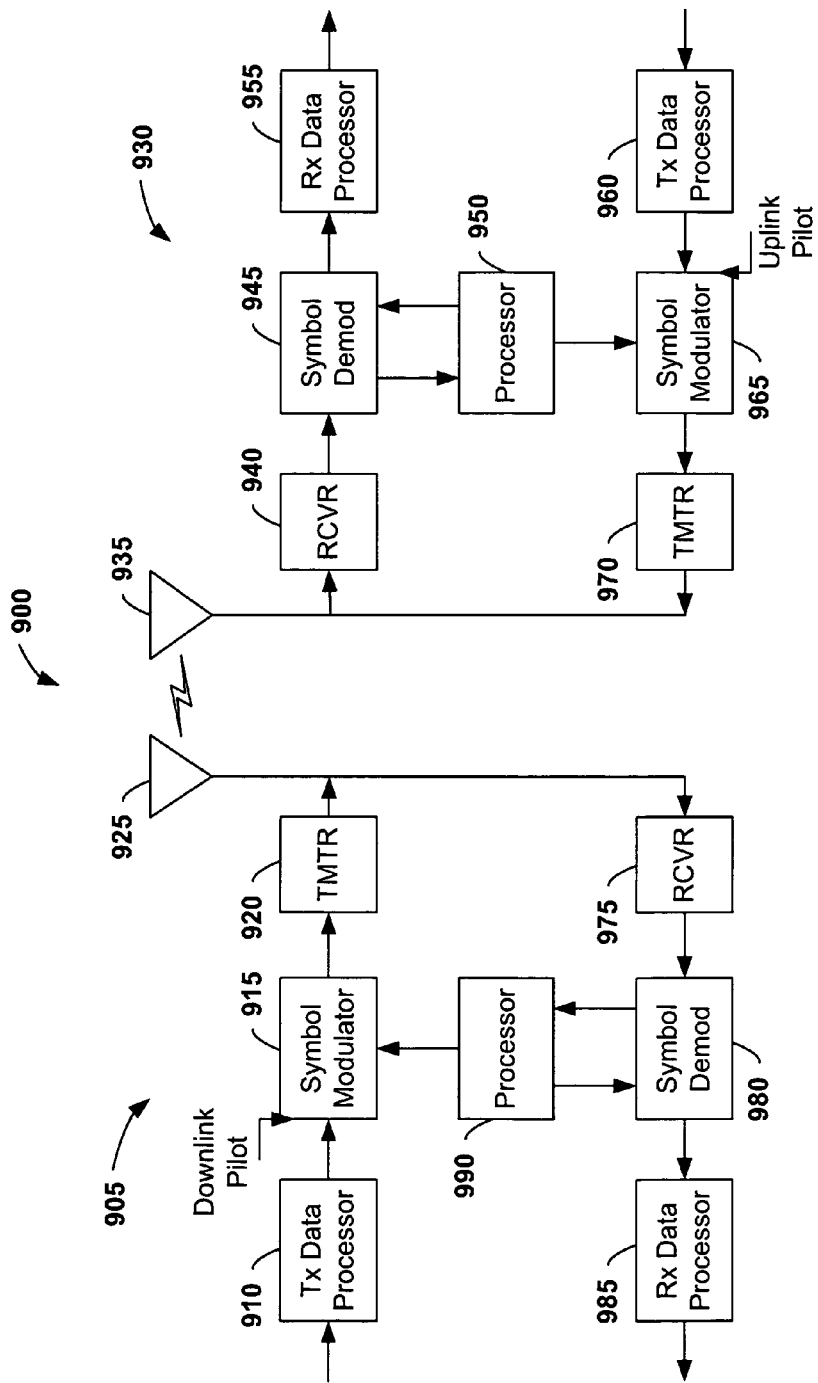
FIG. 9 is a diagram illustrating an example transceiver for a wireless system.

FIG. 9 shows an exemplary wireless communication system 900. The wireless communication system 900 depicts one base station and one terminal for sake of brevity. However, it is to be appreciated that the system can include more than one base station and/or more than one terminal, wherein additional base stations and/or terminals can be substantially similar or different for the exemplary base station and terminal described below.

Figure 5A:
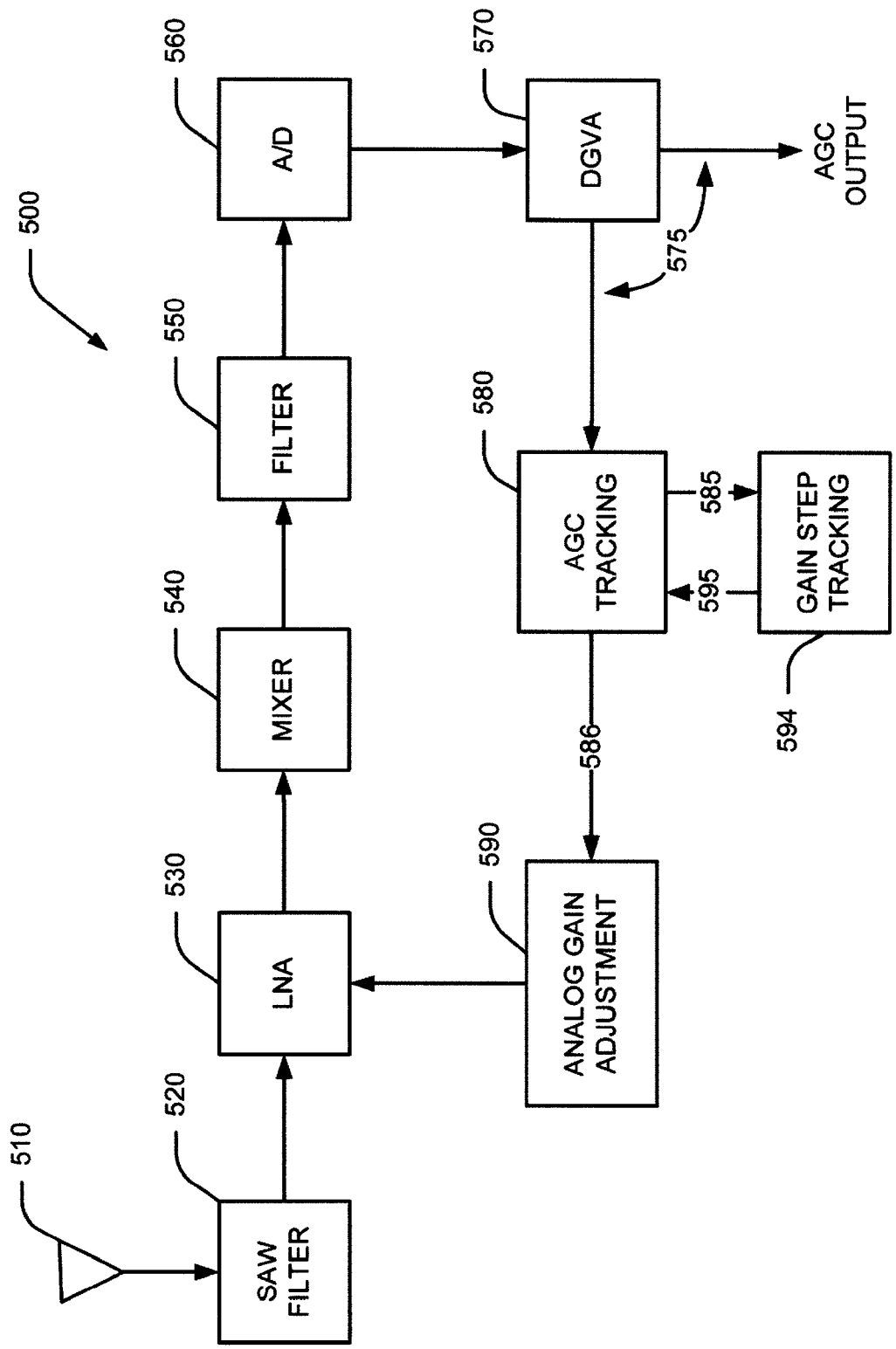
FIGS. 5A and 5B illustrate an example automatic gain control block.

Proceeding to FIG. 5A, an example automatic gain control block 500 is illustrated. In this example, signal is received via antenna 510 and processed by a SAW (Surface Acoustic Wave) filter 520 before being sent to a low noise amplifier (LNA) 530. From the LNA 530, the signal is sent to a mixer 540 before being processed by a base band filter 550. Output from the filter 550 is processed by an analog to digital converter (A/D) 560 which sends digital signal information to a digital variable gain amplifier (DVGA) 570. An AGC tracking component 580 is employed to monitor and track the energy of AGC output signal 575 from the DVGA 570. Based on the output 586 of the AGC tracking block 580, the analog gain adjustments block 590 controls the LNA 530 and the Mixer 540 blocks. As shown, a gain step magnitude tracking component 594 is provided to monitor the AGC tracking component 580 and perform the analog gain step magnitude tracking. As can be appreciated, other configurations are possible for the AGC block 500.

Figure 5B:
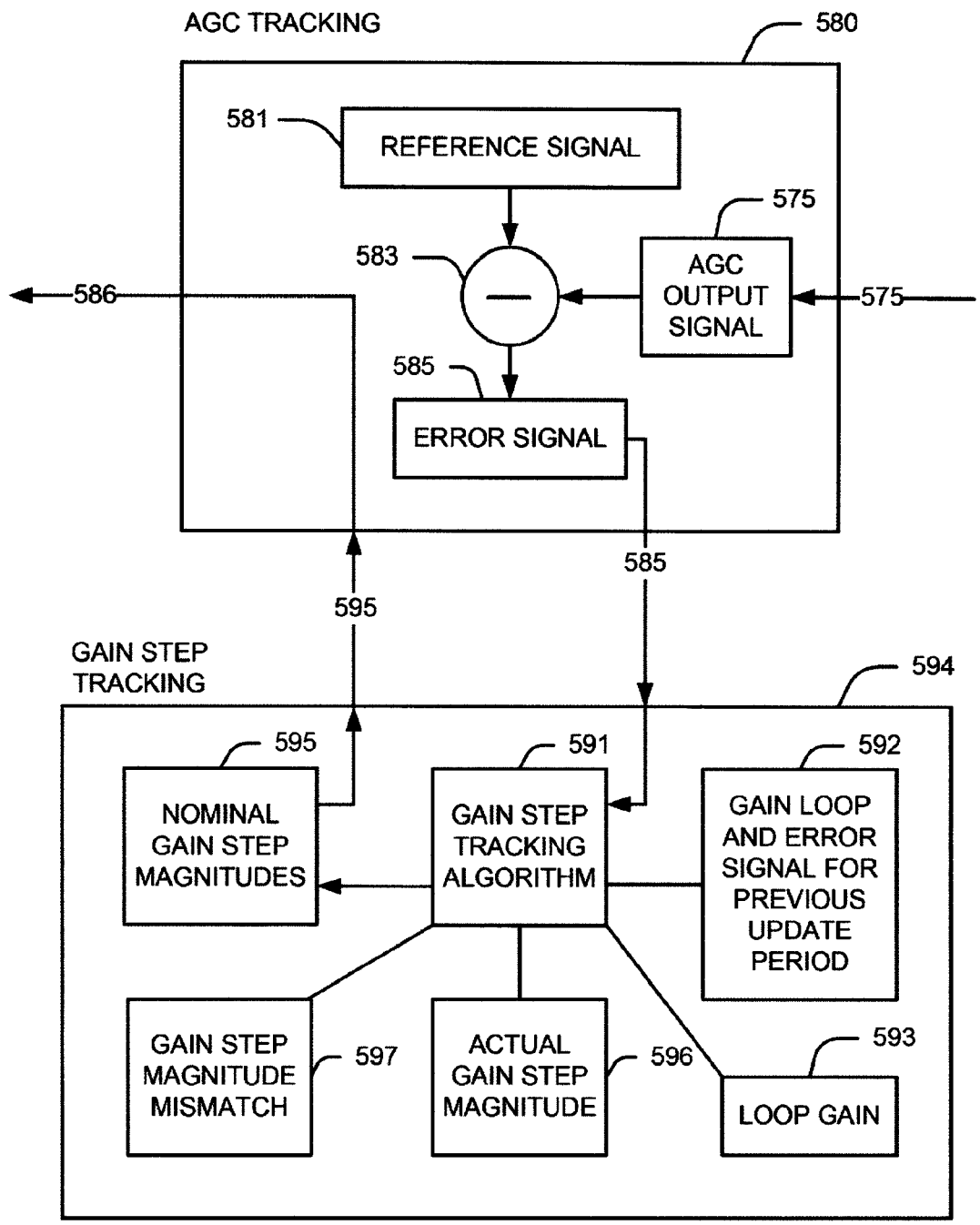

FIG. 5B depicts configuration and operation of the AGC tracking block 580 and gain step tracking module 594 of FIG. 5A. As indicated above, the AGC tracking block 580 monitors output energy of the AGC output signal 575. After one or more gain state adjustments by the LNA 530, block 580 calculates an error signal 585 as a difference 583 between a reference signal 581 and the AGC output signal 575. The error signal 585 is then passed to the gain step tracking component 594. The gain step tracking component 594 executes a gain step tracking algorithm 591, which is used to update nominal gain step magnitudes 595. In general, algorithm 591 uses error signal 585, as well as gain loop and error signal information 592 from the previous update period to calculate gain step magnitude mismatch 597 between actual gain step magnitudes 596, which are calculated from the error signal 585, and the stored nominal gain step magnitudes 595, which were used to adjust LNA 530 gain state, as described in greater detail herein above. The gain step tracking algorithm 591 then multiplies the gain step magnitude mismatch 597 with a selected loop gain 593, such as a first-order loop gain $K_{StepMag}$, to generate a correction to the nominal gain step magnitudes 595 that track changes to the actual gain step magnitudes 596. The algorithm 591 then updates the nominal gain step magnitudes 595 with the corrected values based on the calculated gain step magnitude mismatch 597. The updated nominal gain step magnitudes 595 are passed to the AGC tracking block 580, which then performs analog gain adjustments to the LNA 530 via analog gain adjustments block 590.

TMTR 920 receives and converts the stream of symbols into one or more analog signals and further conditions (e.g., amplifies, filters, and frequency up converts) the analog signals to generate a downlink signal suitable for transmission over the wireless channel. The downlink signal is then transmitted through an antenna 925 to the terminals. At terminal 930, an antenna 935 receives the downlink signal and provides a received signal to a receiver unit (RCVR) 940. Receiver unit 940 conditions (e.g., filters, amplifies, and frequency down converts) the received signal and digitizes the conditioned signal to obtain samples. A symbol demodulator 945 demodulates and provides received pilot symbols to a processor 950 for channel estimation. Symbol demodulator 945 further receives a frequency response estimate for the downlink from processor 950, performs data demodulation on the received data symbols to obtain data symbol estimates (which are estimates of the transmitted data symbols), and provides the data symbol estimates to an RX data processor 955, which demodulates (i.e., symbol de-maps), de-interleaves, and decodes the data symbol estimates to recover the transmitted traffic data. The processing by symbol demodulator 945 and RX data processor 955 is complementary to the processing by symbol modulator 915 and TX data processor 910, respectively, at access point 905.

On the uplink, a TX data processor 960 processes traffic data and provides data symbols. A symbol modulator 965 receives and multiplexes the data symbols with pilot symbols, performs modulation, and provides a stream of symbols. A transmitter unit 970 then receives and processes the stream of symbols to generate an uplink signal, which is transmitted by the antenna 935 to the access point 905.

At access point 905, the uplink signal from terminal 930 is received by the antenna 925 and processed by a receiver unit 975 to obtain samples. A symbol demodulator 980 then processes the samples and provides received pilot symbols and data symbol estimates for the uplink. An RX data processor 985 processes the data symbol estimates to recover the traffic data transmitted by terminal 930. A processor 990 performs channel estimation for each active terminal transmitting on the uplink. Multiple terminals may transmit pilot concurrently on the uplink on their respective assigned sets of pilot subbands, where the pilot subband sets may be interlaced.

Processors 990 and 950 direct (e.g., control, coordinate, manage, etc.) operation at access point 905 and terminal 930, respectively. Respective processors 990 and 950 can be associated with memory units (not shown) that store program codes and data. Processors 990 and 950 can also perform computations to derive frequency and impulse response estimates for the uplink and downlink, respectively.

For a multiple-access system (e.g., FDMA, OFDMA, CDMA, TDMA, etc.), multiple terminals can transmit concurrently on the uplink. The techniques described herein may be implemented by various means. For example, these techniques may be implemented in hardware, software, or a combination thereof. For a hardware implementation, the processing units used for channel estimation may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof. With software, implementation can be through modules (e.g., procedures, functions, and so on) that perform the functions described herein. The software codes may be stored in memory unit and executed by the processors 990 and 950.

For a software implementation, the techniques described herein may be implemented with modules (e.g., procedures, functions, and so on) that perform the functions described herein. The software codes may be stored in memory units and executed by processors. The memory unit may be implemented within the processor or external to the processor, in which case it can be communicatively coupled to the processor via various means as is known in the art.

What has been described above includes exemplary embodiments. It is, of course, not possible to describe every conceivable combination of components or methodologies for purposes of describing the embodiments, but one of ordinary skill in the art may recognize that many further combinations and permutations are possible. Accordingly, these embodiments are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A method to track gain step magnitudes in an automatic gain control (AGC) module of a receiver, the method comprising:
   storing one or more nominal gain step magnitudes for at least one amplifier;
   adjusting a gain state of the at least one amplifier in one or more stored nominal gain steps;
   monitoring output energy of the AGC module after at least one gain state adjustment;
   calculating a mismatch between nominal gain step magnitudes and actual gain step magnitudes of the at least one amplifier based in part on the output energy of the AGC module; and
   updating the stored one or more nominal gain step magnitudes to track the actual gain step magnitudes of the at least one amplifier by multiplying the gain step magnitude mismatch by a loop gain, the loop gain based in part on power fluctuation across a received signal.

2. The method of claim 1, further comprising calculating gain step magnitude mismatch after N gain state adjustments, where N is an integer greater than or equal to 2.

3. The method of claim 1, further comprising analyzing a noisy observation of the gain step magnitude mismatch.

4. The method of claim 3, further comprising applying multiplying the gain step magnitude mismatch by a lower loop gain to suppress observation noise of the gain step magnitude mismatch.

5. The method of claim 1, wherein the received signal includes on one or more OFDM symbols.

6. The method of claim 1, further comprising calculating the gain step magnitude mismatch as a function of a difference between a reference level and output energy of the AGC module.

7. The method of claim 1, further comprising employing a first order loop to track the actual gain step magnitudes.

8. The method of claim 1, further comprising updating at least one register that stores the nominal gain step magnitudes.

9. The method of claim 1, further comprising storing output energy and loop gain for an update period before a gain state adjustment.

10. An automatic gain control (AGC) module for a receiver, comprising:
    an analog amplifier for amplifying an input RF signal, the analog amplifier configured to operate at a plurality of discrete analog gain states having different gain magnitudes;
    a digital variable gain amplifier (DVGA) operably coupled to the analog amplifier for amplifying or attenuating digitized output of the analog amplifier to maintain an output signal of the AGC module at a substantially constant level by varying gain of the DVGA by one or more digital gain steps having nominal gain step magnitudes;
    a gain tracking component operably coupled to the analog amplifier and DVGA, the gain tracking component configured to (i) monitor energy of the output signal of the AGC module and (ii) adjust gain state of the analog amplifier by one or more analog gain steps having nominal gain step magnitudes when energy of the output signal of the AGC module is above or below a reference level; and
    a gain step magnitude component operably coupled to the gain tracking component, the gain step magnitude component configured to (i) store one or more nominal gain step magnitudes, (ii) after one or more analog gain state adjustments, calculate a mismatch between nominal gain step magnitudes and actual gain step magnitudes of the AGC module, and (iii) update the stored one or more nominal gain step magnitudes to track the actual gain step magnitudes based on the gain step magnitude mismatch.

11. The module of claim 10, further comprising a low noise amplifier (LNA) or a mixer to receive one or more analog gain state switching commands from gain tracking component and adjusts the analog gain states based in part on the commands.

12. The module of claim 10, wherein the gain step magnitude component further configured to calculate gain step magnitude mismatch after at least two analog gain state adjustments.

13. The module of claim 10, wherein the gain step magnitude component further configured to multiply the gain step magnitude mismatch by a loop gain to produce one or more updated nominal gain step magnitudes that track actual gain step magnitudes.

14. The module of claim 13, wherein the gain step magnitude component employs a first order loop to track the actual gain step magnitudes.

15. The module of claim 10, further comprising at least one analog to digital converter operably coupled to the analog amplifier for digitizing output of the analog amplifier.

16. The module of claim 10, wherein the gain step magnitude module comprises one or more registers for storing and updating one or more nominal gain step magnitudes.

17. The module of claim 10, wherein the gain step magnitude component is further configured to calculate the gain step magnitude mismatch as a function of a difference between a reference level and output energy of the AGC module.

18. The module of claim 10, wherein the gain tracking component comprises a feedback that is applied between the analog amplifier and DVGA to control overall loop gain in the AGC module.

19. The module of claim 10, wherein the gain step magnitude mismatch is a noisy observation of mismatch between nominal gain step magnitudes and actual gain step magnitudes of the AGC module.

20. The module of claim 10, further comprising a machine readable medium having machine executable instructions stored thereon to execute the gain tracking component or the gain step magnitude component.

21. A system for determining analog gain step magnitude in a receiver, comprising:
   means for storing one or more nominal gain step magnitudes for at least one amplifier;
   means for adjusting gain state of at least one amplifier in one or more nominal gain steps;
   means for monitoring output energy of the AGC module after at least one gain state adjustment of at least one amplifier;
   means for calculating a mismatch between nominal gain step magnitudes and actual gain step magnitudes of at least one amplifier based in part on the output energy of the AGC module; and
   means for updating the stored one or more nominal gain step magnitudes to track the actual gain step magnitudes based on the calculated the gain step magnitude mismatch.

22. The system of claim 21, further comprising means for calculating gain step magnitude mismatch after N gain state adjustments, where N is an integer greater than or equal to 2.

23. The system of claim 21, further comprising means for analyzing a noisy observation of the gain step magnitude mismatch.

24. The system of claim 21, further comprising means for multiplying the gain step magnitude mismatch by a loop gain to produce an updated nominal gain step magnitude for the at least one amplifier, the loop gain is based in part on power fluctuation across a received signal.

25. The system of claim 24, wherein the received signal includes on one or more OFDM symbols.

26. The system of claim 21, further comprising means for multiplying the gain step magnitude mismatch by a lower loop gain to suppress observation noise of the gain step magnitude mismatch.

27. The system of claim 21, further comprising means for calculating the gain step magnitude mismatch as a function of a difference between a reference level and output energy of the AGC module.

28. The system of claim 21, further comprising means for employing a first order loop to track the actual gain step magnitudes.

29. The system of claim 21, further comprising means for updating at least one register that stores the nominal gain step magnitudes.

30. The system of claim 21, further comprising means for storing output energy and loop gain for an update period before a gain state adjustment.

31. A non-transitory machine readable medium having machine executable instructions stored thereon for controlling operation of a receiver in a wireless communication device, the medium comprising:
   instructions for storing in a data storage medium of the wireless communication device one or more nominal gain step magnitudes for at least one amplifier of an automatic gain control (AGC) module of the receiver;
   instructions for adjusting gain state of at least one amplifier in one or more stored nominal gain steps;
   instructions for tracking an output energy from the AGC module after at least one gain state adjustment of the amplifier;
   instructions for calculating a mismatch between nominal gain step magnitudes and actual gain step magnitudes of the amplifier based in part on the output energy from the AGC module; and
   instructions for updating the stored one or more nominal gain step magnitudes to track the actual gain step magnitudes by multiplying the gain step magnitude mismatch by a loop gain, the loop gain based in part on power fluctuation across a received signal.

32. The medium of claim 31, further comprising instructions for calculating gain step magnitude mismatch after N gain state adjustments, where N is an integer greater than or equal to 2.

33. The medium of claim 31, further comprising instructions for analyzing a noisy observation of the gain step magnitude mismatch.

34. The medium of claim 31, wherein the received signal includes on one or more OFDM symbols.

35. The medium of claim 31, further comprising instructions for multiplying the gain step magnitude mismatch by a lower loop gain to suppress observation noise of the gain step magnitude mismatch.

36. The medium of claim 31, further comprising instructions for calculating the gain step magnitude mismatch as a function of a difference between a reference level and output energy of the AGC module.

37. The medium of claim 31, further comprising instructions for employing a first order loop to track the actual gain step magnitudes.

38. The medium of claim 31, further comprising instructions for updating at least one register that stores the nominal gain step magnitudes.

39. The medium of claim 31, further comprising instructions for storing output energy and loop gain for an update period before a gain state adjustment.

40. A wireless communications device, comprising:
   an automatic gain control (AGC) module comprising at least one amplifier;
   a memory configured to store nominal gain step magnitudes for the at least one amplifier; and
   a processor configured to
      monitor output energy of AGC module,
      adjust gain state of the at least one amplifier by one or more gain steps having nominal gain step magnitudes when output energy of AGC module is above or below a reference level,
      calculate a mismatch between nominal gain step magnitudes and actual gain step magnitudes of the AGC module, and
      update the one or more nominal gain step magnitudes stored in the memory to track the actual gain step magnitudes by multiplying the gain step magnitude mismatch by a loop gain, the loop gain based in part on power fluctuation across a received signal.

41. The device of claim 40, wherein the processor further configured to calculate gain step magnitude mismatch after N gain state adjustments, where N is an integer greater than or equal to 2.

42. The device of claim 40, wherein the processor further configured to analyze a noisy observation of the gain step magnitude mismatch.

43. The device of claim 40, wherein the received signal includes on one or more OFDM symbols.

44. The device of claim 40, wherein the processor further configured to multiply the gain step magnitude mismatch by a lower loop gain to suppress observation noise of the gain step magnitude mismatch.

45. The device of claim 40, wherein the processor further configured to calculate the gain step magnitude mismatch as a function of a difference between a reference level and output energy of the AGC module.

46. The device of claim 40, wherein the processor further configured to employ a first order loop to track the actual gain step magnitudes.

47. The device of claim 40, wherein the processor further configured to update at least one register of the memory that stores the nominal gain step magnitudes.

48. The device of claim 40, wherein the processor further configured to store in the memory output energy and loop gain for an update period before a gain state adjustment.

* * * * *